(12) United States Patent
Ohashi et al.

(10) Patent No.: US 7,866,853 B2
(45) Date of Patent: Jan. 11, 2011

(54) LIGHT-EMITTING ELEMENT MOUNTING SUBSTRATE AND MANUFACTURING METHOD THEREOF, LIGHT-EMITTING ELEMENT MODULE AND MANUFACTURING METHOD THEREOF, DISPLAY DEVICE, LIGHTING DEVICE, AND TRAFFIC LIGHT

(75) Inventors: Masakazu Ohashi, Sakura (JP); Ken-ichi Uruga, Tokyo (JP); Masanori Ito, Tokyo (JP)

(73) Assignee: Fujikura Ltd., Tokyo (JP)

( * ) Notice: Subject to any disclaimer, the term of this patent is extended or adjusted under 35 U.S.C. 154(b) by 70 days.

(21) Appl. No.: 12/325,113

(22) Filed: Nov. 28, 2008

(65) Prior Publication Data

US 2009/0122554 A1 May 14, 2009

Related U.S. Application Data

(63) Continuation of application No. PCT/JP2006/310897, filed on May 31, 2006.

(51) Int. Cl.
*F21V 7/00* (2006.01)

(52) U.S. Cl. ............... 362/296.01; 362/297; 362/296.04

(58) Field of Classification Search ................. 362/226, 362/249, 240, 241, 296.01, 297, 299, 300, 362/301, 307, 310, 296.04, 326, 327, 329, 362/330, 294
See application file for complete search history.

(56) References Cited

U.S. PATENT DOCUMENTS

| | | | | |
|---|---|---|---|---|
| 5,584,296 A | * | 12/1996 | Cui et al. ..................... 600/479 |
| 5,633,629 A | * | 5/1997 | Hochstein .................... 340/907 |
| 5,690,421 A | * | 11/1997 | Shea et al. ................... 362/293 |
| 5,990,421 A | * | 11/1999 | Yee ............................. 174/260 |
| 5,998,925 A | | 12/1999 | Shimizu et al. |
| 6,949,772 B2 | * | 9/2005 | Shimizu et al. ............... 257/99 |
| 7,196,459 B2 | | 3/2007 | Morris |
| 7,238,967 B2 | * | 7/2007 | Kuwabara et al. ............ 257/98 |
| 7,572,039 B2 | * | 8/2009 | Kimura et al. ............... 362/411 |
| 2003/0080341 A1 | * | 5/2003 | Sakano et al. ................ 257/79 |
| 2003/0186799 A1 | | 10/2003 | Beyrle |
| 2003/0193055 A1 | | 10/2003 | Martter et al. |
| 2003/0219919 A1 | * | 11/2003 | Wang et al. ................... 438/26 |
| 2005/0122018 A1 | | 6/2005 | Morris |

FOREIGN PATENT DOCUMENTS

| | | |
|---|---|---|
| JP | 60-74485 A | 4/1985 |
| JP | 62-84942 U | 5/1987 |
| JP | 03-119770 A | 5/1991 |
| JP | 03-230586 A | 10/1991 |
| JP | 2000-208815 A | 7/2000 |

(Continued)

*Primary Examiner*—Sandra L O Shea
*Assistant Examiner*—Danielle Allen
(74) *Attorney, Agent, or Firm*—Sughrue Mion, PLLC

(57) ABSTRACT

The present invention provides a light-emitting element mounting substrate which includes: a core metal provided with a reflective cup which reflects light emitted from a mounted light-emitting element in a prescribed direction; and an enamel layer having a thickness within a range of 50 μm to 200 μm, and provided on a surface of the core metal. The present invention also provides a light-emitting element module in which a light-emitting element is provided on this light-emitting element mounting substrate, and in which the light-emitting element is sealed with a transparent sealing resin.

12 Claims, 5 Drawing Sheets

FOREIGN PATENT DOCUMENTS

| | | | |
|---|---|---|---|
| JP | 2001-332768 A | 11/2001 | |
| JP | 2001-332769 A | 11/2001 | |
| JP | 2004-207621 A | 7/2004 | |
| JP | 2005-175427 A | 6/2005 | |
| JP | 2006-093626 A | 4/2006 | |
| JP | 2006-147865 A | 6/2006 | |
| TW | I220282 B | 8/2004 | |
| WO | 2007/138695 A1 | 6/2007 | |

* cited by examiner

LIGHT-EMITTING ELEMENT MOUNTING SUBSTRATE AND MANUFACTURING METHOD THEREOF, LIGHT-EMITTING ELEMENT MODULE AND MANUFACTURING METHOD THEREOF, DISPLAY DEVICE, LIGHTING DEVICE, AND TRAFFIC LIGHT

TECHNICAL FIELD

The present invention relates to a light-emitting element mounting substrate which serves to mount a light-emitting element such as a light-emitting diode (hereinafter referred to as "LED"), and manufacturing method thereof, to a light-emitting element module which mounts and packages a light-emitting element on this substrate, and manufacturing method thereof, and to a display device, lighting device and traffic light which use this light-emitting element module.

BACKGROUND ART

With respect to light-emitting element modules which mount and package light-emitting elements such as LEDs, a surface-mount type package structure like that shown in FIG. 10 has heretofore been used when attempting to miniaturize the packaging structure. In this light-emitting element module, a concave portion is provided in a substrate 3 composed of resin or ceramic, two positive/negative electrodes 4, 4 are arranged on the bottom face of the concave portion, and a light-emitting element 1 is electrically connected and fixed to one of the electrodes 4 via conductive paste or the like. The top side of the light-emitting element 1 is electrically connected to the other electrode 4 by a wire bonding 2 such as gold wire. These electrodes 4, 4 extend to the exterior of the substrate. After mounting the light-emitting element 1, the concave portion is filled with a sealing resin 5 of high optical transmittance such as epoxy resin, and the sealing resin 5 is cured to seal the light-emitting element 1. Particularly in the case of white LEDs, a blue LED is used as the light-emitting element, and a blue-excited yellow-emitting fluorescent material is mixed into sealing resin which is similarly used to fill the reflective concave portion.

Heretofore, as applications which mount numerous light-emitting elements on one substrate, dot matrix units which are lighting devices and display devices have been common. To enable mounting of numerous light-emitting elements such as LEDs, these devices generally mount numerous light-emitting elements on a substrate made of glass-fiber-reinforced epoxy resin or the like, and are commercialized as unit products, A substrate for this type of LED unit is disclosed, for example, in Patent Document 1.

As a conventional structure of this LED unit, one may adopt a structure in which numerous bullet type LEDs are mounted onto an electronic substrate, or a form in which numerous surface-mount type LEDs are mounted. To manufacture this unit it is necessary to adopt a process wherein the bullet type or surface-amount type LEDs are fabricated, and electrically connected by soldering or the like to an electronic substrate on which an electronic circuit pattern that suits their needs has been prepared. Accordingly, it is necessary to have a two-stage production process pertaining to the bullet type or surface-mount type LEDs and the LED units in which they are assembled.

With respect to the manufacture of light-emitting element modules such as LED units, a manufacturing method referred to as the chip-on-board method, in which light-emitting elements are directly mounted onto an electronic substrate, is becoming major in recent years. By directly mounting the light-emitting elements onto an electronic substrate, this method has the advantage of obviating the aforementioned process of semi-finished productions, and also enabling simplification of structure.

On the other hand, when mounting light-emitting elements such as LEDs onto a substrate, it is necessary to adopt a packaging structure having reflective cups which are concave portions with sloped reflective surfaces in order to orient the direction of optical emission in the forward direction. The form of this reflective cup has the functions of controlling light-emitting conditions by appropriately designing and holding the resin that seals the light-emitting element. Furthermore, in conjunction with the increasingly high light-emission intensities of light-emitting elements in recent years, it has become important to endow the electronic substrate on which the light-emitting elements are mounted with a heat dissipation function.

In light of these demands, as shown in FIG. 11, a structure has come to predominate in which a substrate is provided with a heat dissipation metal board 8 such as aluminum board or copper board and an insulating layer 7 provided on the board 8. The LED unit shown in FIG. 11 adopts a structure wherein the insulating layer 7 is provided on the heat dissipation metal board 8, multiple electrodes 4 are provided on the insulating layer 7, light-emitting elements 1 are provided on these electrodes 4, the top side of the respective light-emitting element 1 is electrically connected to the adjacent electrode by a wire bonding 2, a reflective board 6 which has multiple holes having sloped parts 6a is placed so that the respective light-emitting element 1 is positioned at the center of the hole, and the light-emitting elements 1 are scaled by filling the respective holes with sealing resin 5 and then curing the sealing resin 5. FIG. 12 is a plan view of the state where the light-emitting elements 1 are mounted on the substrate. This structure is disclosed, for example, in Patent Document 2.

The electrode structure of this case is shown in FIG. 13, and its electrical circuit configuration is shown in FIG. 14.

A light-emitting element module of the chip-on-board method is generally manufactured by the following process.

1. A light-emitting element is mounted on an electrode in a reflective cup of a substrate by using silver paste or, when the electrode material of the light-emitting element is AuSn or the like, by a so-called eutectic soldering—a connection in which heat and vibration are imparted—resulting in electrical continuity. Furthermore, the light-emitting element is connected to a counter electrode by a wire bonding. With respect to light-emitting elements having electrodes on only one side, two positive/negative electrodes are both subjected to wire bonding. Furthermore, with respect to light-emitting elements having electrodes on only one side, it is also possible to connect by flip-chip packaging via bumps composed of gold or the like arranged on top of the electrodes.

2. The interior of the reflective cup is filled with sealing resin, curing treatment is performed by a method of curing the employed resin such as heat curing or UV curing, and molding is conducted. In cases where the fabricated light-emitting element module is a white LED module, a fluorescent material is intermixed with the sealing resin in advance before curing.

3. A lens body made of resin, glass or the like may be combined as necessary with the top of the sealing resin and the top of the light-emitting element module.

On the other hand, when undertaking to directly mount light-emitting elements onto the substrate without providing reflective cups, as shown in FIG. 15, one may also conceive of a method where electrodes 12 are disposed on a flat substrate 11, light emitting elements 9 and wire bondings 10 are mounted onto the electrodes 12 by the same method described above, and sealing resin 13 is molded by a molding method such as transfer molding such that the light-emitting elements 9 and wire bondings 10 are subjected to resin sealing. However, with this method, it is difficult to dispose the sealing resin 13 in accurate positions due to problems such as the dimensional tolerance of the substrate. Furthermore, in the case of white LEDs, as fluorescent material is intermixed with the sealing resin 13, when the form of the sealing resin 13 is unstable, variations arise in the distance pertaining to the passage of the light emitted from the light-emitting elements 9 through the interior of the sealing resin 13 containing fluorescent material, thereby becoming difficult to control the color as required.

[Patent Document 1] Japanese Unexamined Patent Application, First Publication No. 2001-332768.

[Patent Document 2] Japanese Unexamined Patent Application, First Publication No. 2001-332769.

DISCLOSURE OF THE INVENTION

Problems to be Solved by the Invention

There are the following problems with the background art.

With respect to the packaging structure of the surface-mount type, the electrodes must transit the interior of a base material, requiring assembly to be conducted by lamination of members.

Conventional multilayered aluminum substrates and aluminum nitride substrates have sufficient heat dissipation properties, but in order to fabricate the reflective cup shape, it is necessary to further stack a reflective-cup-forming base material on the substrate in the aforementioned manner. When particular emphasis is placed on heat dissipation properties, it goes without saying that it is appropriate to use metal as the material for configuring the substrate from the standpoint of thermal conductivity, but when metal is used in the substrate, it also has properties of electrical conductivity, resulting in the necessity of performing insulating treatment between the electrode and the base material. This insulating sheet also constitutes an element in the laminar structure, further complicating the structure.

The attachment of this reflective-cup-forming base material is ordinarily conducted by an adhesive agent or by thermal pressing. For reasons such as the low degree of smoothness of the substrate or lack of uniformity in application of the adhesive agent required for attachment, interstices arise between the reflective-cup-forming base material and the substrate, which lead to the occurrence of bubbles when sealing resin is subsequently inserted into the cup. When bubbles remain inside the sealing resin, light from the light-emitting element is greatly scattered by the bubbles, resulting in the problem that optical extraction efficiency from the light-emitting element greatly diminishes.

Moreover, the problem of additional cost arises, because reflective-cup-forming base material is required apart from the substrate, and an extra stage is required in assembly.

The present invention was made in view of the above circumstances, and has an object of providing a light-emitting element mounting substrate which has excellent optical extraction efficiency from a light-emitting element and which can be produced at low cost, and its manufacturing method, a light-emitting element module which mounts and packages a light-emitting element on the substrate and its manufacturing method, and a display device, lighting device and traffic light which use this light-emitting element module.

Means for Solving the Problems

In order to achieve the aforementioned objectives, the present invention provides a light-emitting element mounting substrate which includes: a core metal provided with a reflective cup which reflects light emitted from a mounted light-emitting element in a prescribed direction; and an enamel layer having a thickness within a range of 50 µm to 200 µm, and provided on a surface of the core metal.

In the light-emitting element mounting substrate of the present invention, it is preferable to provide a groove at a circumferential edge of a bottom part of the reflective cup.

In present invention also provides a light-emitting element module which mounts a light-emitting element on the light-emitting element mounting substrate of the present invention, in which the light-emitting element is sealed with transparent sealing resin.

In the light-emitting element module of the present invention, it is preferable that the light-emitting element be a white light-emitting diode that is formed by mixing fluorescent material into the sealing resin, and emits white light.

The present invention provides a method of manufacturing a light-emitting element mounting substrate which includes: forming a reflective cup which reflects light emitted from a mounted light-emitting element in a prescribed direction, at a predetermined position on a core metal; and subsequently applying and baking enamel material on a surface of the core metal, to form an enamel layer which has a thickness within a range of 50 µm to 200 µm on the surface of the core metal.

In the method of manufacturing a light-emitting element mounting substrate of the present invention, it is preferable to conduct electrodeposition of an enamel material whose primary component is glass onto the surface of the core metal, and to subsequently conduct baking.

The present invention also provides a method of manufacturing a light-emitting element module, which includes: forming a light-emitting element mounting substrate by forming a reflective cup which reflects light emitted from a mounted light-emitting element in a prescribed direction, at a predetermined position on a core metal, and subsequently applying and baking enamel material on a surface of the core metal, to form an enamel layer which has a thickness within a range of 50 µm to 200 µm on the surface of the core metal; subsequently forming electrodes on the surface of the light-emitting element mounting substrate; subsequently mounting a light-emitting element onto the electrode at the center portion of the reflective cup so as to electrically connect the electrode and the light-emitting element; and subsequently filling the reflective cup with resin and curing the resin to seal the light-emitting element.

In the method of manufacturing a light-emitting element module of the present invention, it is preferable to seal the light-emitting element by resin which is intermixed with fluorescent material.

In the method of manufacturing a light-emitting element module of the present invention, it is preferable that the light-emitting element be a blue light emitting diode, and that the fluorescent material be blue-excited yellow-emitting fluorescent material.

The present invention also provides a display device which has the aforementioned light-emitting element module of the present invention.

The present invention also provides a lighting device which has the aforementioned light-emitting element module of the present invention.

The present invention also provides a traffic light which has the aforementioned light-emitting element module of the present invention.

Advantageous Effects of the Invention

According to the present invention, as a reflective cup on which a light-emitting element is mounted is provided in a light-emitting element mounting substrate, there is no need to conduct manufacture by superimposing a reflective-cup-forming base material which is separate from the substrate onto the substrate, thereby enabling simplification of the substrate structure, and reducing the cost of assembly.

By omitting a reflective-cup-forming base material which is separate from the substrate, it is possible to prevent the incorporation of bubbles into the sealing resin, and prevent reductions in the efficiency of optical extraction from the light-emitting element.

As a groove is formed at the circumferential edge of the bottom part of the reflective cup, there is no rounding of the circumferential edge of the bottom part due to melting of glass when the enamel layer is baked, thereby preserving the portion at the center of the bottom part where the light-emitting element is mounted.

As a light-emitting element mounting substrate which provides an enamel layer on the surface of a core metal is used, heat dissipation properties are excellent, and the light-emitting intensity of light-emitting elements such as LEDs can be raised.

DESCRIPTION OF THE REFERENCE SYMBOLS

| | |
|---|---|
| 20, 30, 40 | light-emitting element module |
| 21, 31, 41 | enameled substrate (light-emitting element mounting substrate) |
| 22, 32, 42 | core metal |
| 23, 33, 43 | enamel layer |
| 24, 34, 44 | light-emitting element |
| 25, 35, 45 | wire bonding |
| 26, 36, 46 | sealing resin |
| 27, 37, 47 | electrode |
| 28, 38, 48, 51, 56, 60 | reflective cup |
| 29a, 39a, 49a, 52, 57 | bottom part |
| 29b, 39b, 49b, 53, 58 | sloped part |
| 50, 54, 59 | groove |

BEST MODE FOR CARRYING OUT THE INVENTION

Embodiments of the present invention are described below with reference to drawings.

Figure 1:
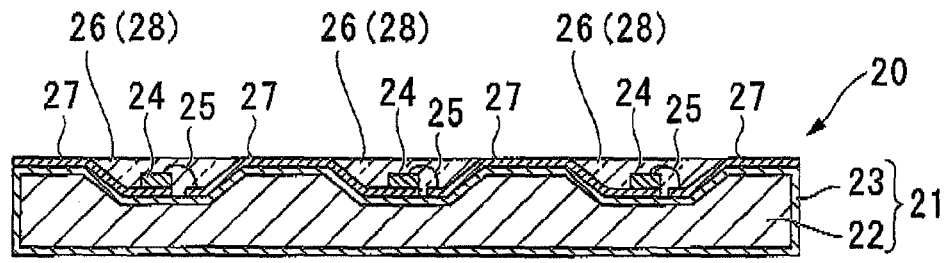
FIG. 1 is a sectional view which shows a first embodiment of a light-emitting element module of the present invention.
Figure 2:
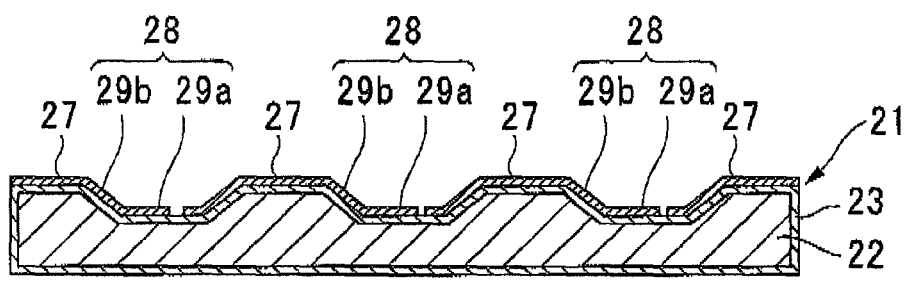
FIG. 2 is a sectional view which shows a first embodiment of an enameled substrate of the present invention.
Figure 3:
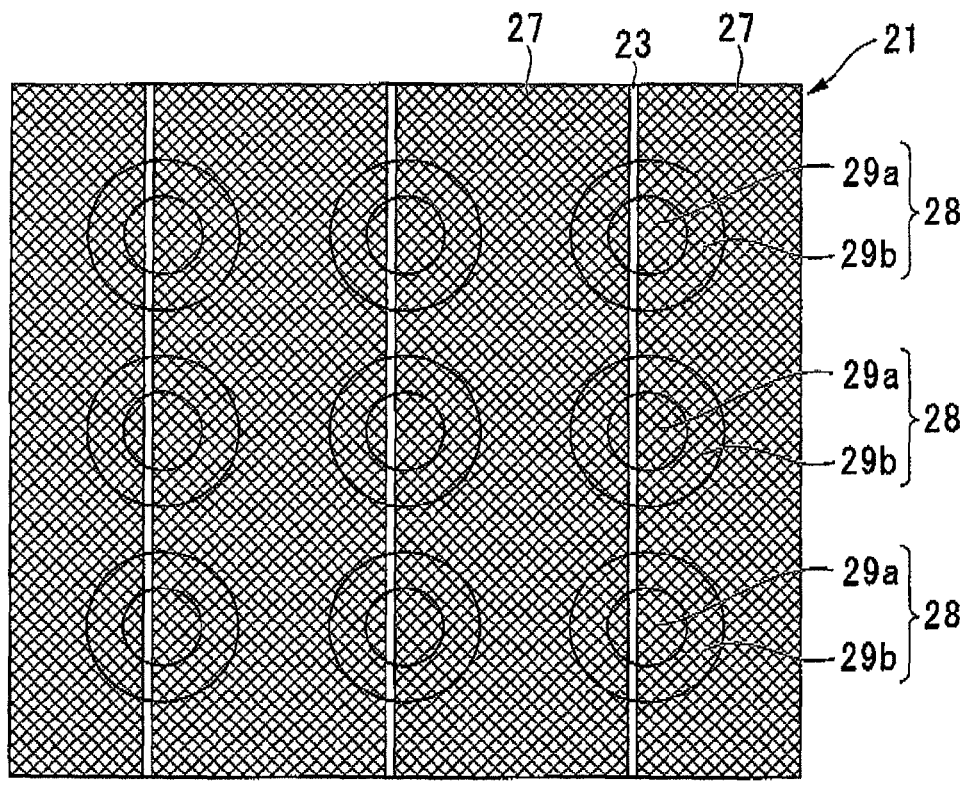
FIG. 3 is a plan view which shows the first embodiment of the enameled substrate of the present invention.

FIG. 1 to FIG. 3 are drawings which show a first embodiment of the present invention, FIG. 1 is a sectional view of a light-emitting element module; FIG. 2 is a sectional view of a light-emitting element mounting substrate (hereinafter referred to as "enameled substrate") used in this light-emitting element module; and FIG. 3 is a plan view of this enameled substrate. In these drawings, reference numeral 20 is a light-emitting element module, 21 is an enameled substrate, 22 is a core metal, 23 is an enamel layer, 24 is a light-emitting element such as an LED, 25 is a wire bonding, 26 is sealing resin, 27 is an electrode, 28 is a reflective cup, 29a is a bottom part, and 29b is a sloped part.

As shown in FIG. 2 and FIG. 3, the enameled substrate 21 of this embodiment adopts a configuration in which the enamel layer 23 with a thickness ranging from 50 μm to 200 μm is provided on the surface of the core metal 22 on which the multiple reflective cups 28 that reflect the light emitted from the mounted light-emitting elements 24 in a prescribed direction are provided in vertical and horizontal rows.

As shown in FIG. 1, the light-emitting element module 20 of the present embodiment adopts a configuration which includes: the enameled substrate 21; the electrodes 27 provided in multiple divisions on the top surface of the enameled substrate 21; the light-emitting elements 24 mounted on the electrodes 27 at the center of the bottom parts 29a of the respective reflecting cups 28; the wire bondings 25 which electrically connect the tops of the respective light-emitting elements 24 with the adjacent electrodes 27; and transparent sealing resin 26 which fills the interior of each reflecting cup 28 and is cured to seal the light-emitting elements 24.

The core metal 22 of the enameled substrate 21 can be prepared using various types of metal material, and while there are no particular limitations on the material, it is preferable to use material which is inexpensive and easy to work such as low carbon steel and stainless steel. In the present illustrations, a square plate-like core metal 22 is used, but the shape of the core metal 22 is not limited to this, and may be selected at one's discretion according to the applications and the like of the light-emitting element module 20.

As to the method for forming the reflective cups 28 in this core metal 22, they can be simply formed by a machining process which uses machining tools such as drills, a polishing process using an ultrahard grindstone, and so on.

With respect to the shape of the concave portion of the formed reflective cups 28, it is preferable that the shape have a flat bottom part 29*a* and a sloped part 29*b* with an inclination that gradually widens upwards from the circumferential edge of the bottom part 29*a*.

The material of the enamel layer 23 disposed on the surface of this core metal 22 can be selected for use from among materials primarily composed of glass which are conventionally used to form enamel layers on metal surfaces. In the present invention, the thickness range of the enamel layer 23 disposed on the surface of the core metal 22 is 50 μm to 200 μm. When the thickness of the enamel layer 23 is less than 50 μm, there is a possibility of occurrence of cracking in the enamel layer at the time of baking onto the surface of the core metal 22, and so exposure of the internal metal core to the outside, resulting in occurring a decline in insulating performance as well as a decline in the long-term reliability of the substrate due to oxidation and the like of the core metal 22. When the thickness of the enamel layer 23 exceeds 200 μm, the possibility of cracking in the enamel layer likewise arises, and furthermore there is the problem that the enamel layer tends to collect at the circumferential edge of the bottom part 29*a* during baking, with the result that the light-emitting element 24 is not able to be mounted on the bottom part 29*a* due to a reduction in mounting space. In the present invention, by forming an enamel layer 23 with a thickness range of 50 μm to 200 μm on the surface of the core metal 22, it is possible to form a uniform enamel layer 23 which obtains excellent insulating performance and which is free of cracks. Moreover, with an enamel layer 23 of this thickness, the shape of the underlying core metal 22 can be reproduced as is, and the shapes of the reflective cups 28 formed in the core metal 22 can also be reproduced as is in the enamel layer 23.

The electrodes 27 provided on the top face of the enameled substrate 21 can be formed by silver thick film paste extending to the interior of the reflective cup 28. It is also possible to perform press molding copper foil to conduct attachment to the interior of the reflective cup.

There are no particular limitations on the light-emitting elements 24, and semiconductor light-emitting elements such as LEDs and laser diodes (LDs) may be suitably used. There are also no particular limitations on the emission color of the light-emitting elements 24 used in the present invention—blue, green, red or other emission colors are acceptable. Furthermore, one may use white LEDs which combine semiconductor elements of blue emission color composed of nitride compound semiconductors and fluorescent material (e.g., yttrium-aluminum-garnet fluorescent material activated by cerium) which absorbs the light of the blue color at least in part and which conducts wavelength conversion to light of the visible spectrum. With respect to the multiple light-emitting elements 24 mounted in rows on the enameled substrate 21, LEDs or the like of the same emission color may be used—for example, in applications pertaining to traffic lights, etc.—or LEDs or the like of different emission colors may be sequentially or randomly arranged and used as display devices. Furthermore, display devices using LEDs may be configured by sequentially or randomly arranging numerous blue LEDs, green LEDs and red LEDs on top of the enameled substrate 21 of large area. Moreover, one may configure planar lighting devices of large area by using white LEDs as the light-emitting elements 24 and mounting the numerous white LEDs in vertical and horizontal rows on a large enameled substrate 21.

As the sealing resin 26, one may use such resins as epoxy heat-curable resin, ultraviolet-curable resin and heat-curable silicon resin of high optical transmittance.

As the wire bonding 25, gold wire or the like may be used. This wire bonding 25 may be bonded using the wire bonding devices which are conventionally used to connect light-emitting elements 24 and the like.

With respect to the aforementioned light-emitting element module 20, as reflective cups 28 which mount light-emitting elements are provided on the enameled substrate 21, there is no need to conduct manufacture by superimposing reflective-cup-forming base material which is separate from the substrate onto the substrate, thereby enabling simplification of substrate structure and reduction of the cost of assembly.

In addition, by not using reflective-cup-forming base material which is separate from the substrate, it is possible to prevent the incorporation of bubbles into the sealing resin 26, and to prevent a reduction in the optical extraction efficiency of the light-emitting elements 24.

As the enameled substrate 21 in which the enamel layer 23 is provided on the surface of the core metal 22 is used, heat dissipation properties are excellent, and it is possible to raise the light-emitting intensity of light emitting elements 24 such as LEDs.

With respect to the structure of the enameled substrate 21, a structure is adopted in which the electrodes 24 are exposed on the top face of the substrate, but it is acceptable to distribute resin or the like for purposes of electrically insulating the exposed portions.

It is also acceptable to combine as necessary a lens material composed of resin, glass or the like with the top of the sealing resin 26 or the top of to light-emitting element module 20.

Figure 4:
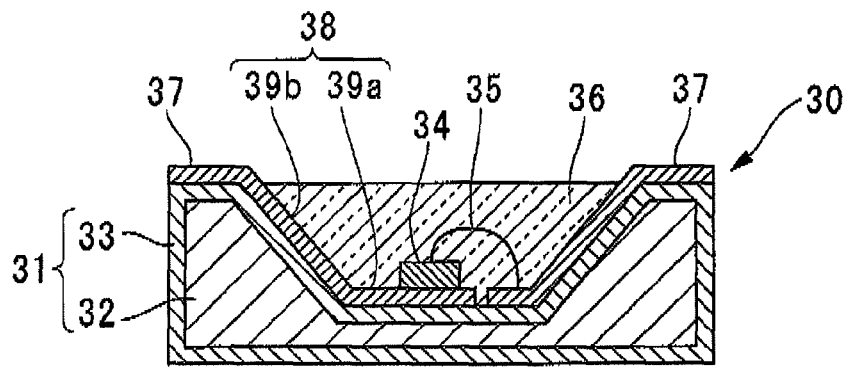
FIG. 4 is a sectional view which shows a second embodiment of a light-emitting element module of the present invention.

FIG. 4 is a sectional view of a light-emitting element module which shows a second embodiment of the present invention. In FIG. 4, reference numeral 30 is a light-emitting element module, 31 is an enameled substrate, 32 is a core metal, 33 is an enamel layer, 34 is a light-emitting element such as an LED, 35 is a wire bonding, 36 is sealing resin, 37 is an electrode, 38 is a reflective cup, 39*a* is a bottom part, and 39*b* is a sloped part.

The light-emitting element module 30 of the present embodiment exhibits a structure which uses an the enameled substrate 31 for the purpose of mounting a stand-alone light-emitting element 34, and is identical to the light-emitting element module 20 of the first embodiment except for the differences pertaining to the shape of the enameled substrate 31 and the number of mounted units of the light-emitting element 34. The enameled substrate 31, core metal 32, enamel layer 33, light-emitting element 34, wire bonding 35, sealing resin 36, electrode 37, and reflective cup 38 configuring this light-emitting element module 30 may be configured identically to the enameled substrate 21, core metal 22, enamel layer 23, light-emitting element 24, wire bonding 25, sealing resin 26, electrode 27, and reflective cup 28 configuring the light-emitting element module 20.

The light-emitting element module 30 of the present embodiment is able to obtain the same effects as the light-emitting element module 20 of the first embodiment.

Figure 5:
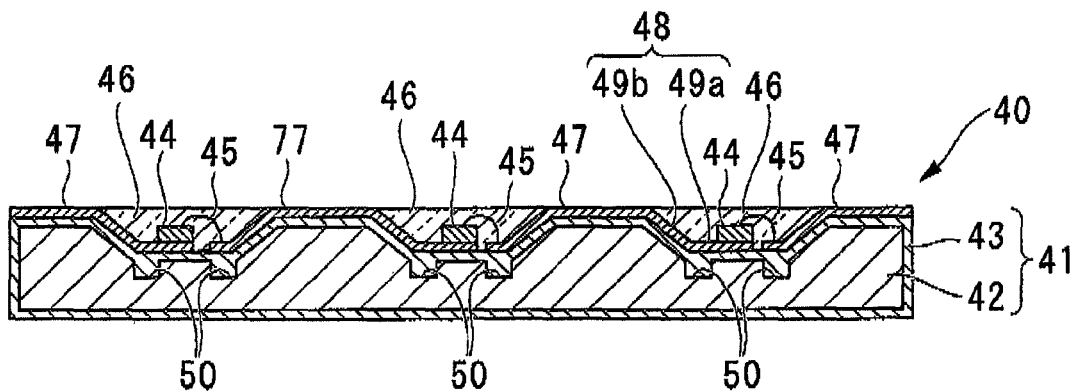
FIG. 5 is a sectional view which shows a third embodiment of a light-emitting element module of the present invention.

FIG. 5 is a sectional view of a light-emitting element module which shows a third embodiment of the present invention. In FIG. 5, reference numeral 40 is a light-emitting element module, 41 is an enameled substrate, 42 is a core metal, 43 is an enamel layer, 44 is a light-emitting element such as an LED, 45 is a wire bonding, 46 is sealing resin, 47 is an electrode, 48 is a reflective cup, 49*a* is a bottom part, and 49*b* is a sloped part.

The light-emitting element module 40 of the present embodiment is identical to the light-emitting element module 20 of the first embodiment except that it uses an enameled substrate 41 on which a groove 50 is disposed around the circumferential edge of the bottom part 49a of the reflective cup 48. The enameled substrate 41, core metal 42, enamel layer 43, light-emitting element 44, wire bonding 45, sealing resin 46, electrode 47, and reflective cup 48 configuring this light-emitting element module 40 may be configured identically to the enameled substrate 21, core metal 22, enamel layer 23, light-emitting element 24, wire bonding 25, sealing resin 26, electrode 27, and reflective cup 28 configuring the light-emitting element module 20 of the first embodiment.

When fabricating the enameled substrate 41 which has the reflective cups 48, enamel material is applied to the core metal 42, and the enamel layer 43 is fixed to the surface of the core metal 42 by baking. When baking, there is a possibility that the glass material may temporarily melt and run prior to baking, resulting in rounding of the circumferential edge of the bottom part of the cup. Depending on the circumstances, this may make it impossible to secure a smooth plane for mounting the light-emitting element 44. In the present embodiment, an enameled substrate 41 having a groove 50 disposed around the circumferential edge of the bottom part 49a is used, with the result that glass material collects in the groove of the circumferential edge of the bottom part, and the remainder of the bottom part 49a can be maintained in a flat state. The portion of the bottom part 49a apart from where the groove 50 is disposed is the portion for mounting the light-emitting element 44. By giving it an appropriate area, it is possible to preserve a flat portion for mounting the light-emitting element.

In the present embodiment, the same effects as the first embodiment are obtained. Furthermore, as a groove 50 is formed at the circumferential edge of the bottom part 49a of the reflective cups 48, there is no rounding of the circumferential edge of the bottom part 49a due to melting of glass during baking of the enamel layer 43, the portion for mounting light-emitting elements 44 at the center of the bottom part is secured, and yield is improved.

Figure 6:
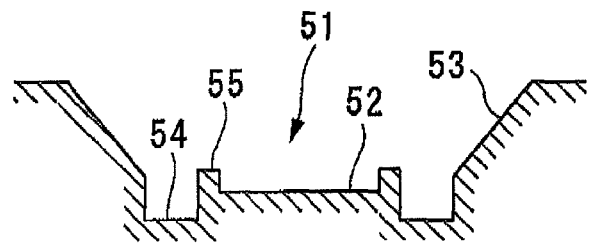
FIG. 6 is a sectional view of an essential part which shows one example of a grooved reflective cup.

FIG. 6 is a figure which shows one example of a grooved reflective cup. In this illustration, a reflective cup 51 adopts a configuration in which a groove 54 is formed between a bottom part 52 and a sloped part 53, and a protrusion 55 is disposed at the circumferential edge of the bottom part 52. With this suture, in addition to providing the groove 54, the protrusion 55 is disposed at the circumferential edge of the bottom part 52, thereby making it possible to prevent melted glass from running into the groove 54.

Figure 7:
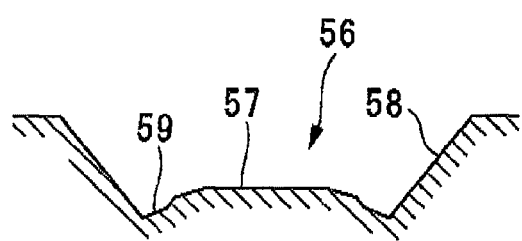
FIG. 7 is a sectional view of an essential part which shows another example of a grooved reflective cup.

FIG. 7 is a figure which shows another example of a grooved reflective cup. In this illustration, a reflective cup 56 adopts a configuration in which, between a bottom part 57 and a sloped part 58, a groove 59 is disposed in a shape that gradually deepens toward the exterior of the bottom part 57. With the groove 59 of this shape, melted glass tends to collect away from the bottom part 57, thereby augmenting the effect of preventing rounding of the circumferential edge of the bottom part 57.

With respect to the method for forming a groove at the circumferential edge of the bottom part of the reflective cup, when the enamel layer is not given a proper thickness, the enamel layer tends to run locally during baking and so hollows tend to be formed in the enamel layer. However, when the electrode is prepared with silver paste, as the paste is in a liquid state before application, electrical continuity can be assured continuously even with parts of this groove.

EXAMPLES

As the core metal, a low carbon steel plate of 50 mm length, 50 mm width and 1 mm thickness was used. By conducting drilling work on the surface of this steel plate, a total of 9 concave portions in vertical and horizontal rows of 3 each were formed in even arrangement. With respect to the dimensions of the bottom faces of these concave portions, the diameter was 1 mm, and depth was 0.5 mm. In addition, sloped parts with an angle of 45° were formed.

Glass powder for formation of an enamel layer was dispersed in a dispersion medium, an aluminum plate constituting the counterelectrode of the core metal was arranged at a distance of 15 mm from the core substrate, and the metal plate and aluminum plate were immersed in the dispersion medium. Furthermore, direct current was applied between this core metal and this aluminum plate in the manner that the metal plate is used as the cathode side, and the glass powder was electro-deposited onto the surface of the core metal. Subsequently, baking was conducted in the open air, and an enamel layer composed of glass was formed on the surface of the core metal to produce the enameled substrate. The electrodes were prepared by applying and baking silver paste onto the enamel layer.

The application of the glass powder was adjusted so as to vary the thickness of the enamel layer, and the enameled substrates shown in Table 1 were produced.

TABLE 1

| | Thickness of enamel on the substrate (μm) | Thickness of enamel at bottom face of concave portions (μm) | Thickness of conductive layer at bottom face of concave portions (μm) | Presence of cracking |
|---|---|---|---|---|
| Example 1 | 50 | 52 | 30 | none |
| Example 2 | 97 | 98 | 31 | none |
| Example 3 | 210 | 200 | 28 | none |
| Reference example 1 | 30 | 34 | 30 | 1 place |
| Reference example 2 | 300 | 320 | 29 | 5 places |

Figure 8:
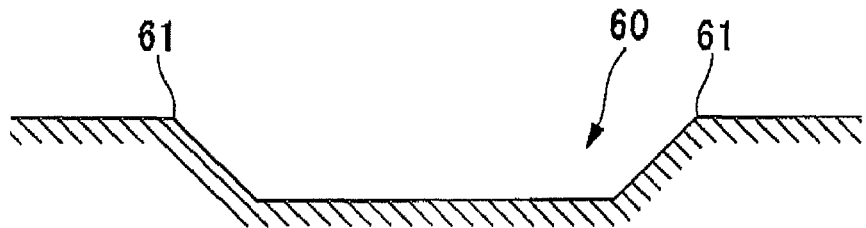
FIG. 8 is a sectional view of an essential part which pertains to reflective cups prepared in examples.

As may be understood from the results of Table 1, in cases where the thickness of the enamel layer on the substrate is 50 μm or greater, no cracking occurs on the substrate. On the other hand, when less than 50 μm, cracking occurs in parts of the enamel layer, and the internal meal core is exposed to the outside. In this case, there is risk of reduction in insulating performance and of reduction in the long-term reliability of the substrate due to oxidation and the like of the core metal. Cracking tends to occur in parts of a shoulder 61 of a reflective cup 60 shown in FIG. 8.

Next, LEDs were mounted on the respective enameled substrates of the aforementioned examples 1 to 3 and reference examples 1 to 2.

The results are shown in Table 2. As the LEDs, blue LEDs configured with InGaN of 300 μm length, 300 μm width and 200 μm thickness alight-emitting center wavelength $\lambda$=460 nm) was used and evaluated.

TABLE 2

| | Thickness of enamel on the substrate (μm) | Thickness of enamel at bottom face of concave portions (μm) | Thickness of conductive layer at bottom face of concave portions (μm) | Mounting of light-emitting element |
|---|---|---|---|---|
| Example 1 | 50 | 52 | 30 | No problem |
| Example 2 | 97 | 98 | 31 | No problem |
| Example 3 | 210 | 200 | 28 | No problem |
| Reference example 1 | 30 | 34 | 30 | No problem |
| Reference example 2 | 300 | 320 | 29 | Mounting could not be confirmed in two places |

Figure 9:
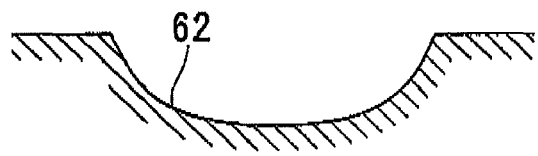
FIG. 9 is a sectional view of an essential part which pertains to a reflective cup whose bottom circumferential edge is rounded.
Figure 10:
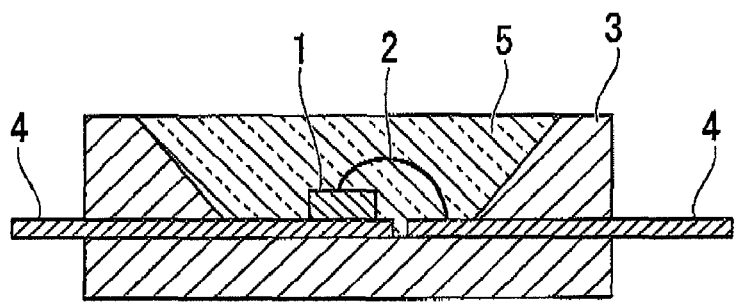
FIG. 10 is a sectional view which illustrates packaging structure of a conventional light-emitting element.
Figure 11:
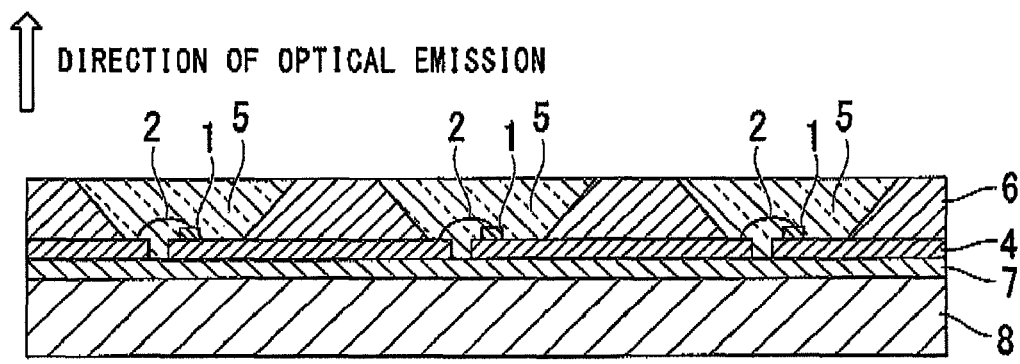
FIG. 11 is a sectional view which shows one example of a conventional light-emitting element module.
Figure 12:
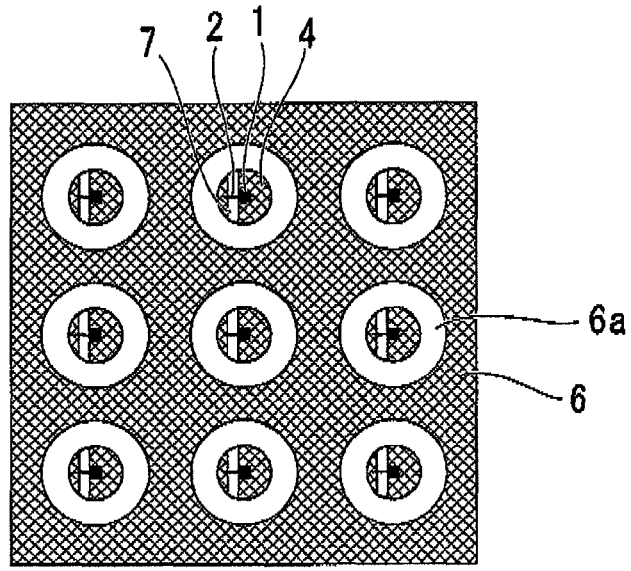
FIG. 12 is a plan view which shows one example of a conventional light-emitting element module.
Figure 13:
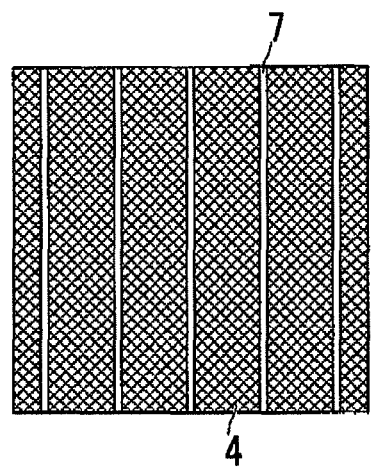
FIG. 13 is a plan view which shows electrode structure of a conventional light-emitting element module.
Figure 14:
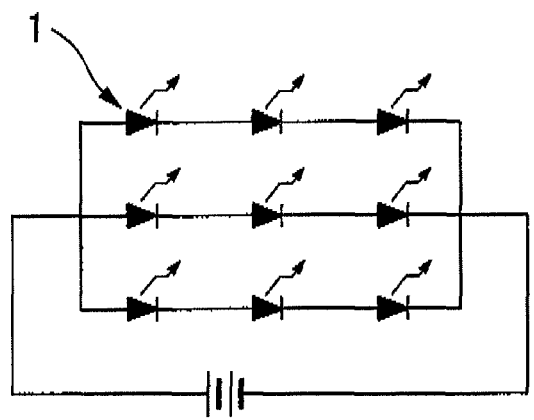
FIG. 14 is an electric circuit diagram of a convention light-emitting element module.
Figure 15:
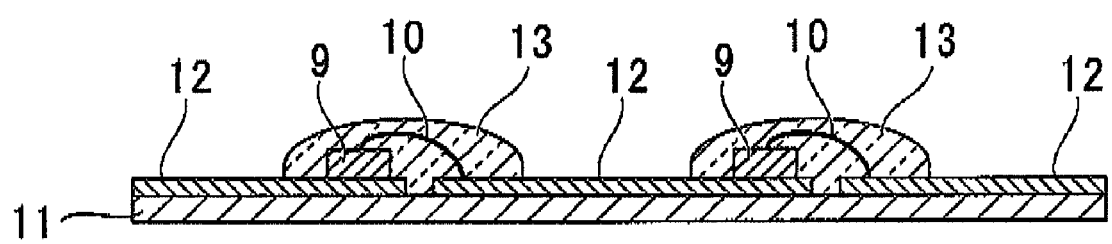
FIG. 15 is a sectional view which shows another example of a conventional light-emitting element module.

Based on the results of Table 2, in reference example 2, the light-emitting elements were unable to be mounted in 2 out of 9 places. As to the reason, upon observation of the sectional profile, it would seem that the form of the substrate at the circumferential edge of the bottom face 62 of the concave portion had adopted a rounded form as shown in FIG. 9, thereby reducing the flat region which enables mounting of the light-emitting element. As to the cause of adoption of this for, it would seem that when the enamel layer underwent baking, the glass powder of the raw material melted, ran, and collected. With an enamel layer of a thickness of 200 μm or less, a sufficient region is secured for mounting of a light-emitting element.

INDUSTRIAL APPLICABILITY

According to the present invention, it is possible to provide a light-emitting element mounting substrate which has excellent optical extraction efficiency from a light-emitting element and which can be produced at low cost, and its manufacturing method, a light-emitting element module which mounts and packages a light-emitting element on the substrate, and its manufacturing method, and a display device, lighting device and traffic light which use this light-emitting element module.

The invention claimed is:

1. A light-emitting element mounting substrate comprising:
    a reflective cup formed in a core metal which reflects light emitted from a mounted light-emitting element in a prescribed direction;
    an enamel layer having a thickness within a range of 50 μm to 200 μm, and provided on a surface of the core metal and the reflective cup; and
    wherein the enamel layer covers the surface of the core metal and reflective cup.

2. The light-emitting element mounting substrate according to claim 1, wherein a groove is provided at a circumferential edge of a bottom part of the reflective cup.

3. A light-emitting element module which mounts a light-emitting element on the light-emitting element mounting substrate according to claim 1 or 2, wherein the light-emitting element is sealed with transparent sealing resin.

4. The light-emitting module according to claim 3, wherein the light-emitting element is a white light-emitting diode that is formed by mixing fluorescent material into the sealing resin, and emits white light.

5. A method of manufacturing a light-emitting element mounting substrate, the method comprising:
    forming a reflective cup which reflects light emitted from a mounted light-emitting element in a prescribed direction, at a predetermined position on a core metal;
    subsequently applying and baking enamel material on a surface of the core metal and the reflective cup, to form an enamel layer which has a thickness within a range of 50 μm to 200 μm on the surface of the core metal and the reflective cup; and
    wherein the enamel layer covers the surface of the core metal and reflective cup.

6. The method of manufacturing a light-emitting element mounting substrate according to claim 5, wherein enamel material whose primary component is glass, is electro deposited onto the surface of the core metal and the reflective cup, and baking is subsequently conducted.

7. A method of manufacturing a light-emitting element module, the method comprising:
    forming a light-emitting element mounting substrate by forming a reflective cup which reflects light emitted from a mounted light-emitting element in a prescribed direction, at a predetermined position on a core metal, and subsequently applying and baking enamel material on a surface of the core metal and the reflective cup, to form an enamel layer which has a thickness within a range of 50 μm to 200 μm on the surface of the core metal and the reflective cup, wherein the enamel layer covers the surface of the core metal and reflective cup;
    subsequently forming electrodes on the surface of the light-emitting element mounting substrate;
    subsequently mounting a light-emitting element onto the electrode at the center portion of the reflective cup so as to electrically connect the electrode and the light-emitting element; and
    subsequently filling the reflective cup with resin and curing the resin to seal the light-emitting element.

8. The method of manufacturing a light-emitting element module according to claim 7, wherein the light-emitting element is sealed by resin which is intermixed with fluorescent material.

9. The method of manufacturing a light-emitting element module according to claim 8, wherein the light-emitting element is a blue light emitting diode, and the fluorescent material is a blue-excited yellow-emitting fluorescent material.

10. A display device comprising the light-emitting element module according to claim 3.

11. A lighting device comprising the light-emitting element module according to claim 4.

12. A traffic light comprising the light-emitting element module according to claim 3.

* * * * *